(12) United States Patent
Wolthek et al.

(10) Patent No.: US 7,532,046 B2
(45) Date of Patent: May 12, 2009

(54) RECEIVER FOR A DIFFERENTIAL DATA BUS

(75) Inventors: Jelle Nico Wolthek, Nijmegen (NL); Cornelis Klaas Waardenburg, Zeeland (NL); Cecilius Gerardus Kwakernaat, Malden (NL); Stefan Gerhard Erich Butselaar, Wijchen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/632,031

(22) PCT Filed: Jun. 30, 2005

(86) PCT No.: PCT/IB2005/052181
§ 371 (c)(1),
(2), (4) Date: Feb. 6, 2008

(87) PCT Pub. No.: WO2006/006105
PCT Pub. Date: Jan. 19, 2006

(65) Prior Publication Data
US 2008/0265969 A1     Oct. 30, 2008

(30) Foreign Application Priority Data
Jul. 7, 2004   (EP) .................................. 04103219
Nov. 18, 2004 (EP) .................................. 04105872

(51) Int. Cl.
*H03B 1/00*   (2006.01)
(52) U.S. Cl. ..................................... 327/108; 327/308
(58) Field of Classification Search ................. 327/108, 327/112, 308; 326/86
See application file for complete search history.

(56) References Cited

U.S. PATENT DOCUMENTS

| | | | |
|---|---|---|---|
| 6,448,815 B1 * | 9/2002 | Talbot et al. | 326/86 |
| 6,734,702 B1 * | 5/2004 | Ikeoku et al. | 326/30 |
| 6,972,588 B1 * | 12/2005 | Wong et al. | 326/26 |
| 7,196,567 B2 * | 3/2007 | Nguyen | 327/308 |

* cited by examiner

*Primary Examiner*—Lincoln Donovan
*Assistant Examiner*—Hai L. Nguyen

(57) ABSTRACT

The invention relates to a receiver for a differential bus with a switch control logic (151), with two branches with resistive elements (7, 61 ... 70, 8 and 5, 11 ... 20, 6) and with switches (3, 80) for switching the resistive elements, in which the switch control logic sets the switches—in a first routine for determining the absolute level of signals on the bus by applying a common mode voltage to the bus, by comparing the voltage on a first resistive branch with a reference voltage, by selecting the correct switch settings, and by writing these settings to an internal storage device,—and in a second routine for minimizing the mismatch between the two resistive branches by applying a common mode voltage to the bus, by comparing the voltage of the second resistive branch with that of the already trimmed first resistive branch, by selecting the correct switch settings for the second branch, and by writing these settings to an internal storage device. The receiver therefore provides good balancing and common mode rejection.

5 Claims, 3 Drawing Sheets

RECEIVER FOR A DIFFERENTIAL DATA BUS

Figure 1:
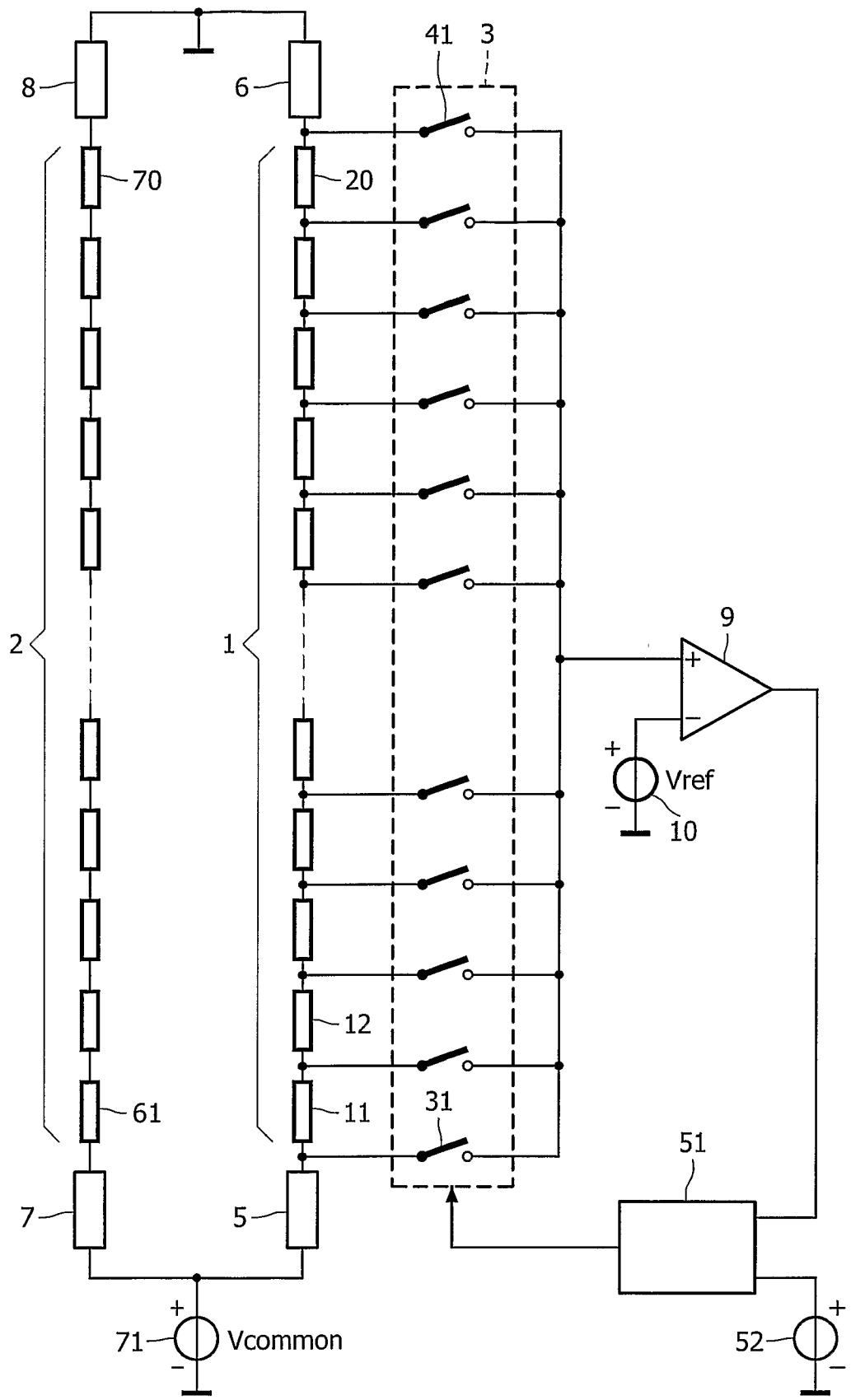

The invention relates to a receiver for a differential data bus that can detect a positive and a negative level with very low mismatch in delay. The main application of this receiver is in automotive data buses such as FlexRay or CAN buses.

According to the state of the art, resistive dividers are used for weakening the differential bus signal in receivers for such data buses. The divided internal bus signal is then fed to two comparators which detect the bus levels.

However, the differential lines of the bus may have a high common mode level at which the receiver must still detect both levels used on the bus highly symmetrically. If there is a mismatch of the ratio of the resistors of the two branches, a mismatch in detection levels of the comparators is introduced. This mismatch will become greater with higher positive or negative common mode voltages on the bus. Furthermore, the absolute switching level of the bus is dependent on the ratio of the resistors of the branches. Spread on this ratio introduces spread on the absolute switching level.

It is an object of the invention to provide a receiver for a differential data bus with improved delay mismatch when detecting the two levels on the bus.

This object is achieved by the receiver having the features according to claim 1:

Receiver for a differential data bus with two branches with resistive elements which are coupled in a series arrangement in which the connections between the resistive elements are coupled to first terminals of switches, wherein one of the switches of each branch is closed for receiving data from the bus and is coupled by its second terminal to comparators, the receiver being provided with a switch control logic which matches the resistive elements in two matching routines:

in a first routine for determining the absolute level of signals on the bus by applying a common mode voltage to the bus, by comparing the voltages at the switches in a first resistive branch with a reference voltage, by selecting the correct switch settings, and by writing these settings to an internal storage device, and in a second routine for minimizing the mismatch between the two resistive branches by applying a common mode voltage to the bus, by comparing the voltages at the switches of the second resistive branch with that of the already trimmed first resistive branch, by selecting the correct switch settings for the second branch, and by writing these settings to an internal storage device.

A receiver according to this concept is relatively simple, it is robust and it occupies relatively little chip area. The two routines ensure a perfect match of the resistors of the two branches, so that a detection of the two levels on the bus is achieved. This also leads to a very low delay mismatch even with possible common mode voltages on the bus.

According to the advantageous measures of claim 2, the perfect match of the resistors in both branches is found by closing the switches in the branches consecutively and by comparing the voltage on the switch, which is closed, with a reference voltage.

Figure 2:
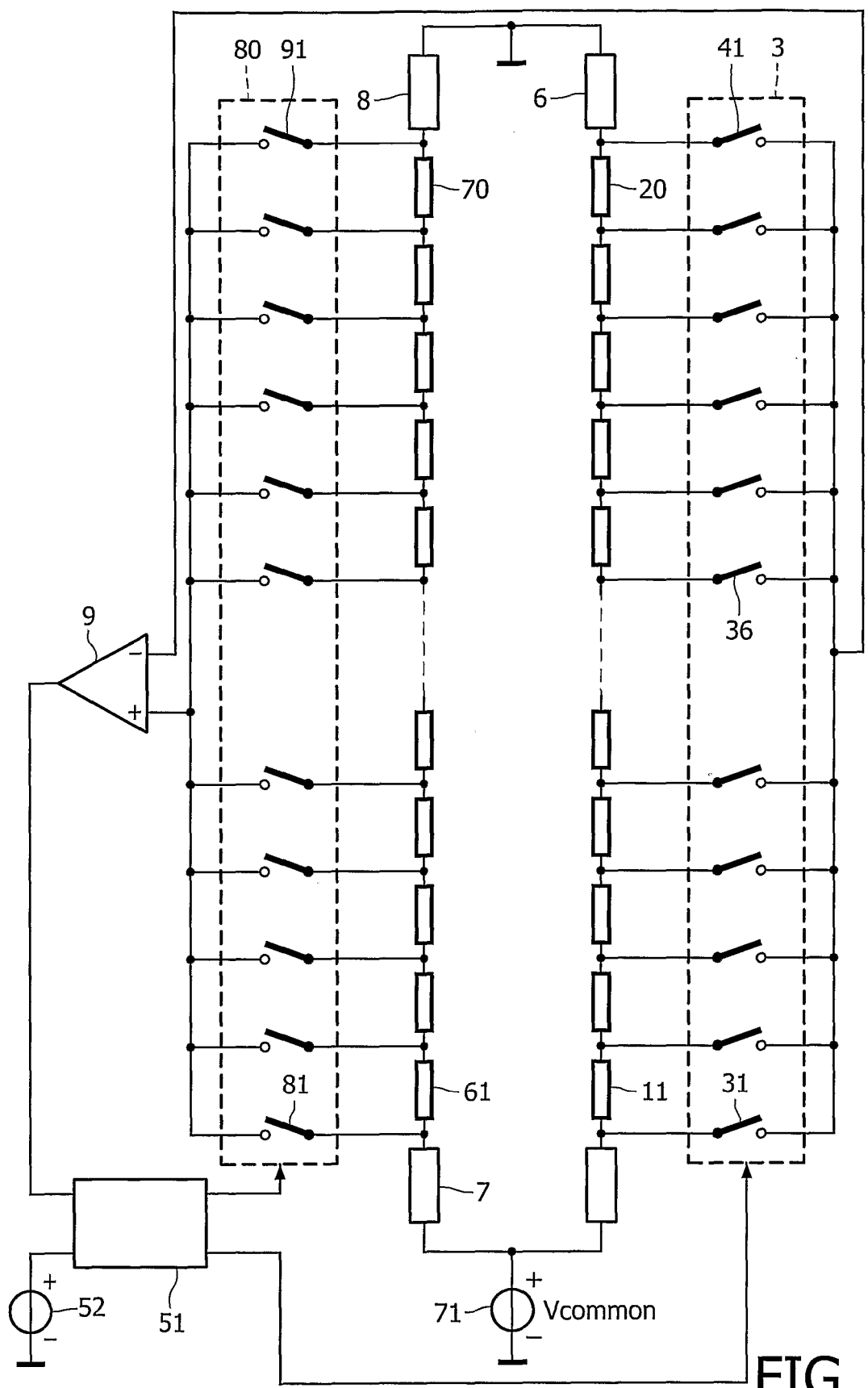
Figure 3:
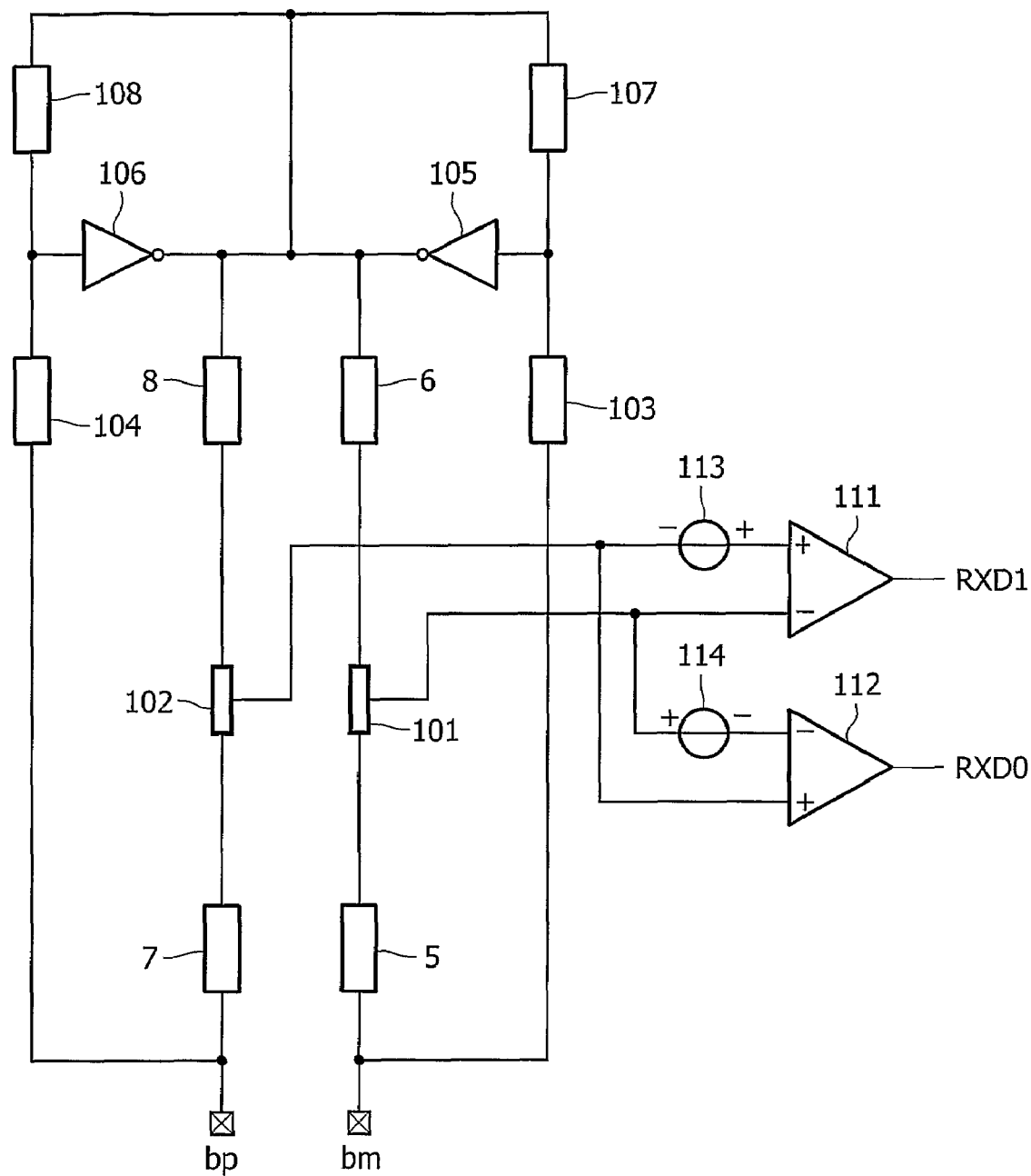

The invention will be further described with reference to the drawings, in which:

FIG. 1 is a schematic block diagram of an embodiment of a receiver according to the invention with a first branch of resistors being matched in a first routine, FIG. 2 is a schematic block diagram of the receiver of FIG. 1 with the second branch of resistors being matched to the first branch in a second routine, and FIG. 3 is a schematic block diagram of the receiver according to FIGS. 1 and 2 with circuitry for receiving data from the data bus.

As explained above, the two resistive branches of a receiver for receiving data from a differential data bus with two lines have to be matched very well in order to detect the two levels on both lines exactly, even with a common mode voltage on the lines, and in order to achieve a low delay mismatch when recognizing the data.

The main idea of the invention is to provide both branches not with fixed resistors but with series connections of resistive elements which can be switched by means of electronic switches. Thus, the resistive values of the branches can be trimmed as desired. This trimming is done in two matching routines, a first routine for matching the first branch and a second routine for matching the second branch.

The schematic diagram of the receiver according to the invention shown in FIG. 1 shows those parts of the circuitry that are involved in the first routine for matching the input resistive elements of the first branch.

The first branch comprises a first resistive element 5 and a final resistive element 6 between which a series arrangement 1 of resistive elements 11 to 29 is coupled. In this example, ten resistive elements 11 to 29 are used, but of course a different number of elements is possible. The connections between the resistive elements 11 to 20, 5 and 6 are coupled to first terminals of switches 31 to 41 of a switching block 3. The second terminals of the switches 31 to 41 are coupled to a positive input of a comparator 9, whose negative input is coupled to a voltage source 10 which supplies a reference voltage Vref.

The output of the comparator 9 is fed to a switch control logic 51, which is supplied with power by a voltage source 52, which is an oscillator that is the clock input for the part that selects the subsequent switches. An output of the switch control logic is connected to the switching block 3. The switch control logic is able to switch every switch 31 to 41 of the switching block on or off individually. When a switch is deselected, the next one is automatically selected.

In parallel to the first branch with resistive elements 5, 6 and 11 to 20 the receiver comprises a second branch with a first resistive element 7, a series arrangement of resistive elements 61 to 70, and a final resistive element 8.

The final resistive elements of both branches are coupled to reference potential.

Only for the purpose of the two matching routines, the inputs of both branches are coupled to voltage source 71 which simulates a common mode voltage on the data bus (not shown in this Figure).

In the first matching routine, the switch control logic 51 first closes the first switch 31, while all other switches are open. The voltage of the second terminal of switch 31 is coupled to the comparator 9, which compares it with the reference voltage Vref. If the reference voltage is lower than the switch voltage, the comparator does not supply any output signal to the switch control logic 51. Consequently, the routine continues. The switch control logic opens switch 31 and closes switch 32. This procedure is continued until a switch is closed whose voltage is lower than the reference voltage. In this case, the comparator 9 feeds a signal to the switch control logic 51 which stops the process as the correct switch position has now been found. This switch position is written to a storage device, that may be located inside the switch control logic and that may be, for example, an EEPROM.

Now the second branch has to be trimmed, which is explained in detail with reference to FIG. 2. In this Figure, circuit elements with the same reference numbers are the same as those in FIG. 1. However, the negative input of the comparator 9 is now coupled to that switch of the switching block 3 of the first branch that was identified in the first routine described above. It is assumed in this example that switch 36 was found to be the correct switch in the first routine. This switch remains closed during the second routine.

FIG. 2 shows a second switching block 80 with switches 81 to 91, which can be controlled by the switching logic 51. As in the first branch, the first terminals of the switches are coupled to the connections of the resistive elements 7, 61 to 70 and 8 of the second branch. The second terminals of these switches are coupled to the positive input of the comparator 9.

In the second routine, the resistive mismatch of the two branches is minimized. The process is the same as that in the first routine in principle. The switches 81 to 91 are closed one after the other until a switch is found whose voltage is lower than the voltage of the switch 36 of the first branch. This switch is then kept closed, and the switching position is internally stored.

After the two routines the mismatches within the branches and that of the two branches relative to each other are minimized for an optimal level detection and a minimal delay mismatch.

FIG. 3 shows an advantageous embodiment for receiving data. In this Figure the two branches of FIGS. 1 and 2 and the switching blocks of these Figures are indicated as blocks 101 and 102. In these blocks, those switches are closed which were found in the two routines described above, so that the two branches are well matched.

The inputs of the branches are coupled to the two lines bm and bp of the differential data bus. These lines are also coupled to the inputs of two inverters 105 and 106 via two first resistors 103 and 104. The outputs of inverters 105 and 106 are coupled via second resistors 107 and 108 to their inputs. The resistors 103, 104, 107 and 108 have high ohmic values compared with the resistive elements of the two branches.

In the blocks 101 and 102, those switches that were found in the two routines are closed and their second terminals are coupled to two comparators 111 and 112, which deliver the output signals RXD0 and RXD1 of the receiver representing the data received from the bus lines bp and bm. The signal of the line bp is coupled to the positive input of the comparator 112 and is coupled via a voltage source 113 to the negative input of comparator 111. The voltage source 113 defines the differential voltage that has to be applied to the bus. This voltage multiplied by the resistive divider defines the differential voltage on the bus. The signal of the line bm is coupled to the positive input of the comparator 111 and is coupled via a voltage source 114 to the negative input of comparator 112.

The resistors 103, 104, 107 and 108 are used to keep the inputs of comparators 111 and 112 around a steady voltage (in practice about 2.5 volts, but it may be any other voltage where 111 and 112 would still work) when a common mode voltage is applied to the bus. When the common mode voltage on the bus (bm and bp) becomes higher, the voltage of the inputs of the inverters 105 and 106 becomes higher and the outputs of the inverters 105 and 106 become lower, so that the inputs of the comparators 111 and 112 stay at a steady voltage. Instead of this, an alternative input stage could be used.

The invention claimed is:

1. Receiver for a differential data bus with two branches with resistive elements, which are coupled in a series arrangement in which the connections between the resistive elements are coupled to first terminals of switches wherein one of the switches of each branch is closed for receiving data from the bus and is coupled by its second terminal to comparators the receiver being provided with a switch control logic 51 which matches the resistive elements in two matching routines:

in a first routine for determining the absolute level of signals on the bus by applying a common mode voltage to the bus, by comparing the voltages at the switches in a first resistive branch consecutively with a reference voltage, by selecting the correct switch setting, at which the voltage at the activated switch has value closest to the reference voltage, and by writing this setting to an internal storage device, and in a second routine for minimizing the mismatch between the two resistive branches by applying a common mode voltage to the bus, by comparing the voltages at the switches of the second resistive branch consecutively with that of the already trimmed first resistive branch, by selecting the correct switch setting for the second branch, at which the voltage at the activated switch has the value closest to the voltage of the switch of the first branch found in the first routine, and by writing this setting to an internal storage device.

2. Receiver as claimed in claim 1, characterized in that the control logic sets the switches during the matching routine such that in the first routine the switches of the first branch are set one after the other beginning with the switch closest to the bus lines and continuing with the next neighbor until the first switch is found, i.e. that switch whose voltage is lower than the reference voltage, this switch being selected as the correct one, and that in the second routine the switches of the second branch are set one after the other beginning with the switch closest to the bus lines and continuing with the next neighbor until the first switch is found, i.e. that switch whose voltage is lower than the voltage of the switch of the first branch whose voltage was equal to the reference voltage in the first routine, this switch being selected as the correct one.

3. Receiver as claimed in claim 1, characterized in that, for receiving data from the bus, the inputs of each of the two branches are coupled via a first resistors to two inverters whose outputs are coupled via second resistors to their inputs.

4. Receiver as claimed in claim 1, characterized in that the differential bus is a data bus in a vehicle.

5. Receiver as claimed in claim 1, characterized in that the differential bus is a data bus according to the FlexRay standard.

* * * * *